(12) United States Patent
Piao et al.

(10) Patent No.: US 8,969,160 B2
(45) Date of Patent: Mar. 3, 2015

(54) ASYMMETRIC SOURCE-DRAIN FIELD-EFFECT TRANSISTOR HAVING A MIXED SCHOTTKY/P-N JUNCTION AND METHOD OF MAKING

(75) Inventors: Yinghua Piao, Shanghai (CN); Dongping Wu, Shanghai (CN); Shili Zhang, Uppsala (SE)

(73) Assignee: Fudan University, Shanghai (CN)

( * ) Notice: Subject to any disclaimer, the term of this patent is extended or adjusted under 35 U.S.C. 154(b) by 92 days.

(21) Appl. No.: 13/641,086

(22) PCT Filed: Apr. 19, 2011

(86) PCT No.: PCT/CN2011/000680
§ 371 (c)(1),
(2), (4) Date: Oct. 12, 2012

(87) PCT Pub. No.: WO2011/134274
PCT Pub. Date: Nov. 3, 2011

(65) Prior Publication Data
US 2013/0032881 A1    Feb. 7, 2013

(30) Foreign Application Priority Data
Apr. 28, 2010    (CN) .......................... 2010 1 0162413

(51) Int. Cl.
| | | |
|---|---|---|
| H01L 29/00 | (2006.01) |
| G01N 27/403 | (2006.01) |
| H01L 27/108 | (2006.01) |
| H01L 21/70 | (2006.01) |
| H01L 29/78 | (2006.01) |
| H01L 21/265 | (2006.01) |
| H01L 29/66 | (2006.01) |
| H01L 29/45 | (2006.01) |
| H01L 29/47 | (2006.01) |

(52) U.S. Cl.
CPC ...... *H01L 29/7839* (2013.01); *H01L 21/26586* (2013.01); *H01L 29/66643* (2013.01); *H01L 29/66659* (2013.01); *H01L 29/7835* (2013.01); *H01L 29/45* (2013.01); *H01L 29/456* (2013.01); *H01L 29/47* (2013.01)
USPC ............ 438/286; 438/253; 438/306; 438/515

(58) Field of Classification Search
CPC .................... H01L 21/26586; H01L 29/66643; H01L 29/66659; H01L 29/47; H01L 29/45; H01L 29/456; H01L 29/7839; H01L 29/7835
USPC .......... 438/286, 301, 253, 306, 515; 257/371, 257/336, 386, 306, 295, 343, E29.256, 257/E21.417
See application file for complete search history.

(56) References Cited

U.S. PATENT DOCUMENTS 5,994,176 A * 11/1999 Wu ............................... 438/200
2003/0235973 A1 * 12/2003 Lu et al. ........................ 438/555
(Continued)

Primary Examiner — Long K Tran
Assistant Examiner — Dzung Tran
(74) Attorney, Agent, or Firm — Jamie J. Zheng, Esq.

(57) ABSTRACT

The present invention is related to microelectronic device technologies. A method for making an asymmetric source-drain field-effect transistor is disclosed. A unique asymmetric source-drain field-effect transistor structure is formed by changing ion implantation tilt angles to control the locations of doped regions formed by two ion implantation processes. The asymmetric source-drain field-effect transistor has structurally asymmetric source/drain regions, one of which is formed of a P-N junction while the other one being formed of a mixed junction, the mixed junction being a mixture of a Schottky junction and a P-N junction.

15 Claims, 7 Drawing Sheets

(56) References Cited

U.S. PATENT DOCUMENTS

| | | | |
|---|---|---|---|
| 2006/0091490 A1* | 5/2006 | Chen et al. | 257/458 |
| 2006/0270153 A1* | 11/2006 | Lee | 438/253 |
| 2007/0148888 A1* | 6/2007 | Krull et al. | 438/306 |
| 2008/0023775 A1* | 1/2008 | Nowak | 257/384 |
| 2008/0099808 A1* | 5/2008 | Burnett et al. | 257/295 |
| 2008/0308878 A1* | 12/2008 | Bulucea | 257/371 |
| 2009/0309164 A1* | 12/2009 | Chen et al. | 257/369 |
| 2010/0244147 A1* | 9/2010 | Yang et al. | 257/408 |

* cited by examiner

ASYMMETRIC SOURCE-DRAIN FIELD-EFFECT TRANSISTOR HAVING A MIXED SCHOTTKY/P-N JUNCTION AND METHOD OF MAKING

FIELD

The present invention is related to microelectronic device technologies, particularly to semiconductor and associated fabrication processes, and more particularly to a field-effect transistor and its method of making.

BACKGROUND

MOS field-effect-transistor (MOSFET) is short for metal-oxide-semiconductor field-effect-transistor, which is a kind of semiconductor device that controls electrical current in semiconductor using the effect of electric field. It is also called unipolar transistor because it relies on one type of charge carriers to participate in conducting electric current. MOS field-effect-transistors can be built using semiconductor materials such as silicon or germanium, or semiconductor compounds such as gallium arsenide, while silicon is mostly used currently. Typically, a MOS field-effect-transistor is comprised mainly of a semiconductor substrate, source and drain, a gate oxide layer and a gate electrode. Its basic structure is generally a four-terminal device, and its middle part has a MOS capacitor structure comprised of metal-insulator-semiconductor. The source and drain are on two sides of the MOS capacitor. In normal operation mode, charge carriers enter through the source and exit through the drain. Above the insulator layer is the gate electrode. By applying a voltage to the gate electrode, the strength of the electric field in the insulator layer can be changed, and the electric field at the surface of the semiconductor can be controlled, thereby changing the conductivity of a surface channel.

A mixed junction is a mixture of a Schottky junction and a P-N junction. It has the advantages of high operating current, fast switching speed, small leakage current, high breakdown voltage, etc.

An asymmetric source-drain field-effect transistor has asymmetrically structured source and drain, one of which is made of a P-N junction while the other being made of a mixed junction, the mixed junction being a mixture of a Schottky junction and a P-N junction. Such a transistor has relatively low leakage current, and its source-drain serial resistance is smaller than the source-drain serial resistance associated with conventional heavily doped P-N junction source-drain field-effect transistors.

SUMMARY

The present invention provides a method of making an asymmetric source-drain field-effect transistor.

In the present invention, an asymmetric source-drain field-effect transistor includes a semiconductor substrate, a gate structure, and source/drain regions having a mixed junction and a P-N junction, respectively. The source/drain regions are asymmetrical, one of which is formed of a P-N junction while the other one is formed of a mixed junction, the mixed junction being a mixture of a Schottky junction and a P-N junction.

The method of making an asymmetric source-drain field-effect transistor, as provided by the present invention, comprises:

a. providing a semiconductor substrate, and forming isolation structures using shallow trench isolation processes;

b. forming a first insulating dielectric layer and an electrode layer over the first insulating dielectric layer, forming a gate structure and pseudo gate structures on two sides of source/drain regions using photolithography and etching processes on the electrode layer and the first insulating layer, and forming first and second windows corresponding to the source and drain regions, the second window having a width smaller than a width of the first window;

c. forming by deposition a second insulating dielectric layer having a thickness smaller than half the width of the second window;

d. etching the second insulating dielectric layer using a selective anisotropic etching process so as to form sidewall structures along two sides of the first window and the second window;

e. performing first ion implantation, choosing an implantation tilt angle to cause ions to arrive at a semiconductor substrate region corresponding to the first window while no ions impinge on a semiconductor region corresponding to the second window, and annealing to activate the implanted ions, thereby forming a P-N junction in the semiconductor substrate in the region corresponding to the first window;

f. performing second ion implantation, choosing an implantation tilt angle to cause ions to arrive at part of the semiconductor substrate in the region corresponding to the second window, annealing to activate the implanted ions, thereby forming a second P-N junction in the semiconductor substrate in the region corresponding to the second window and highly doped region in the semiconductor substrate in the region corresponding to the first window, the highly doped region being within a region formed by the first ion implantation;

g. deposition a metal layer, annealing to cause reaction between the metal layer and the exposed semiconductor substrate in the regions corresponding to the first and second windows, thereby forming a metal-semiconductor-compound conductor layer, and removing part of the metal layer not having reacted with the semiconductor substrate.

Preferably, the source region is formed at the region corresponding to the first window and the drain region is formed at the region corresponding to the second window, or vice versa.

Preferably, the semiconductor substrate is silicon, germanium, silicon-germanium alloy, silicon-on-insulator (SOI) or germanium-on-insulator (GOI), and the semiconductor substrate has a doping density of $1*10^{14}$ to $1*10^{19}$ cm$^{-3}$.

Preferably, the first dielectric layer is silicon dioxide, silicon nitride, aluminum oxide or a hafnium-based high-K dielectric material.

Preferably, the electrode layer includes at least one conductive layer, and the conductive layer includes any of polysilicon, titanium nitride, tantalum nitride, tungsten, and metal silicide, or a multilayer structure thereof.

Preferably, a peak doping density in the semiconductor substrate through the second ion implantation is about $1*10^{19}$ cm$^{-3}$ or higher.

Preferably, the metal layer includes any of nickel, cobalt, titanium, and platinum, or a mixture thereof.

Preferably, the metal-semiconductor-compound conductor layer includes any of nickel silicide, nickel germanide, cobalt silicide, cobalt germanide, titanium silicide, titanium germanide, platinum silicide, and platinum germanide, or a mixture there of.

Steps c) to e) in the above method for making an asymmetric source-drain field-effect transistor, as provided by the present invention, can be replaced by the following steps:

performing first ion implantation, choosing an implantation tilt angle to cause ions to impinge on a semiconductor substrate region corresponding to the first window while no ions impinge on a semiconductor substrate region corresponding to the second window, and annealing to activate the implanted ions, thereby forming a P-N junction in the semiconductor substrate in the region corresponding to the first window;

forming by deposition second insulating dielectric layer having a thickness smaller than half the width of the second window; and etching the second insulating dielectric layer using a selective anisotropic etching process so as to form sidewall structures along two sides of the first window and the second window.

Step f) in the above method for making an asymmetric source-drain field-effect transistor, as provided by the present invention, can be replaced by the following steps:

performing second ion implantation, and annealing to activate the implanted ions, thereby forming a second P-N junction in the semiconductor substrate in the region corresponding to the second window and highly doped region in the semiconductor substrate in the region corresponding to the first window, the highly doped region being within a region formed by the first ion implantation;

removing the sidewall structures by etching, and forming by deposition a third insulator layer thinner than the second insulator layer; and etching the third insulating dielectric layer using an anisotropic etching process, thereby forming second sidewall structures along two sides of the first window and second window.

The embodiments and characteristics of the present invention will be explained in more detail with reference to the drawings.

DESCRIPTION OF EMBODIMENTS

Figure 1:
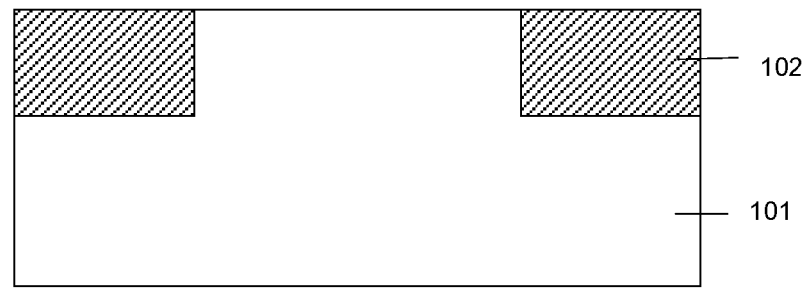
FIG. 1 is a cross-sectional diagram illustrating a semiconductor substrate after formation of shallow trench isolation structures, according to one embodiment of the present invention.

The method of making the asymmetric source-drain field-effect transistor, as provided by the present invention, is described in more detail below with respect to the drawings. In the following description, same reference numerals are used to refer to same components, so that repeated explanations are omitted. In the drawings, for ease of illustration, different layers, regions or components are enlarged or shrunk in different proportions, so their illustrated sizes are not to scale with actual sizes and do not represent proportional relationships of the actual sizes.

It should be noted that many largely different embodiments can be designed without departing from the spirit and scope of the present invention. It is to be understood that except the limitations recited in the appended claims, the present invention is not limited to the specific embodiments described in the specification.

Following is description of making an asymmetric source-drain field-effect transistor according to an embodiment of the present invention.

FIG. 1 is a cross-sectional diagram illustrating a semiconductor substrate after formation of shallow trench isolation structures, according to one embodiment of the present invention. A semiconductor substrate 101 is first prepared and various processes such as cleaning and native oxide removal are completed before film growth. Afterwards, isolation structures 102 around the transistor are fabricated using shallow trench isolation processes. In one embodiment, the semiconductor substrate is single crystal silicon.

Figure 2:
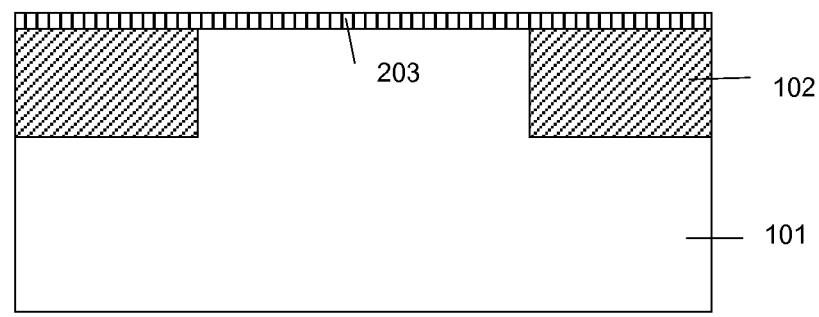
FIG. 2 is a cross-sectional diagram illustrating the semiconductor substrate after a first insulating dielectric layer is formed thereon.
Figure 3:
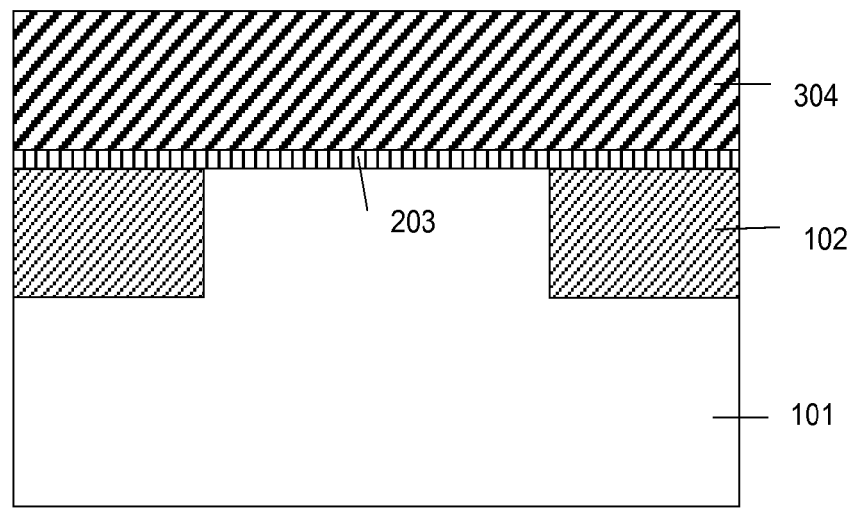
FIG. 3 is a cross-sectional diagram illustrating the semiconductor substrate after an electrode layer is formed thereon.

As shown in FIG. 2, a first insulating dielectric layer 203 is formed on the semiconductor substrate. An electrode layer 304 is formed subsequently on the first insulating dielectric layer 203, as shown by the cross-sectional diagram in FIG. 3.

Figure 4:
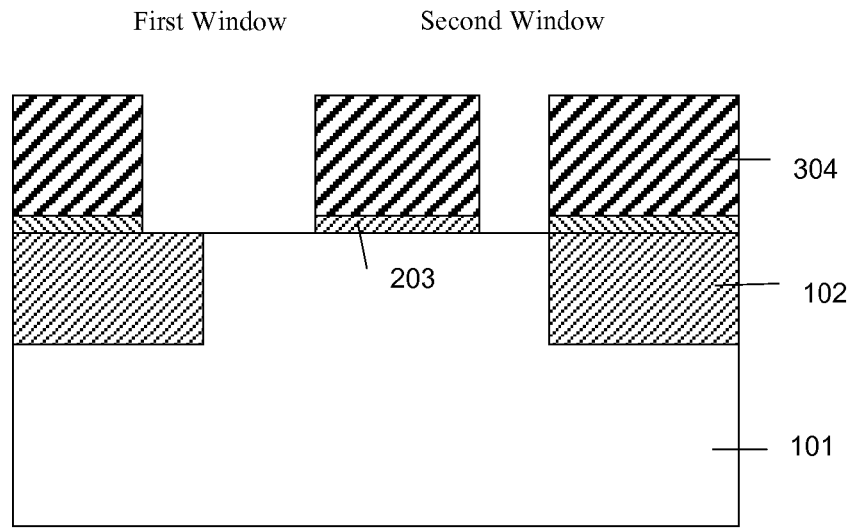
FIG. 4 is a cross-sectional diagram illustrating formation of windows after photolithography and etching.

As shown in FIG. 4, the electrode layer and the first insulating layer are patterned using photolithography and etching processes, and first and second windows are formed at the regions for forming the source and drain. The source region is to be formed in the region corresponding to the first window while the drain region is to be formed in the region corresponding to the second window or vice versa. The first window is wider than the second window.

Figure 5:
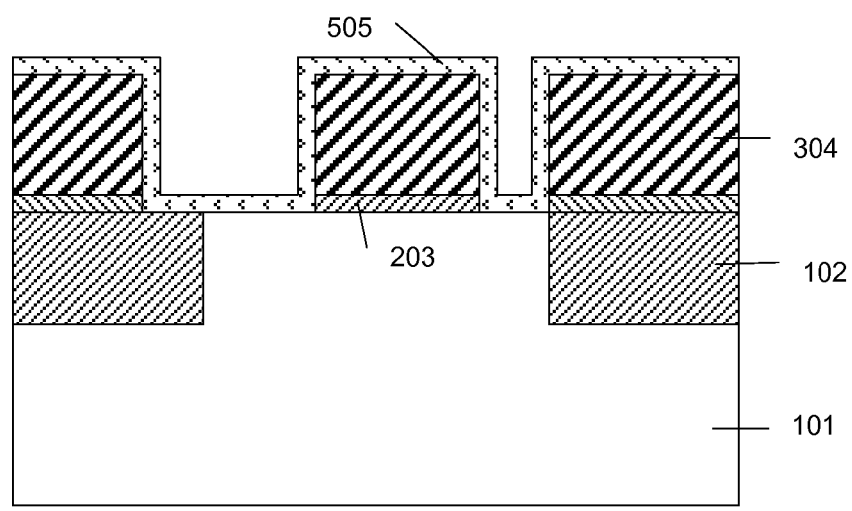
FIG. 5 is a cross-sectional diagram illustrating formation of a second insulating dielectric layer by deposition.

As shown in FIG. 5, a second insulating dielectric layer 505 is deposited. Subsequently, the insulating dielectric layer is anisotropically etched using a dry etch process, forming sidewalls 515. Sidewalls 515 have a thickness smaller than half the width of the second window, as shown by the after-etch cross-sectional diagram in FIG. 6.

Figure 7:
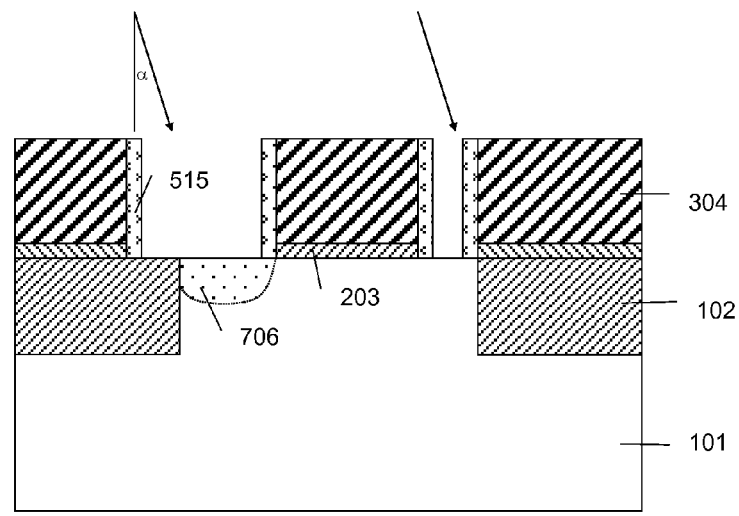
FIG. 7 is a cross-sectional diagram illustrating first ion implantation and subsequent annealing.

As shown in FIG. 7, first ion implantation is performed, and an implantation tilt angle α is selected to cause ions to arrive at the semiconductor substrate exposed in the first window while no ions arrive at the semiconductor substrate exposed in the second window Annealing is performed to activate the implanted ions, thereby forming in the semiconductor substrate in the region corresponding to the first window a doped region 706 with a doping type opposite to that of the substrate. The doped region 706 forms a P-N junction with the substrate.

Figure 8:
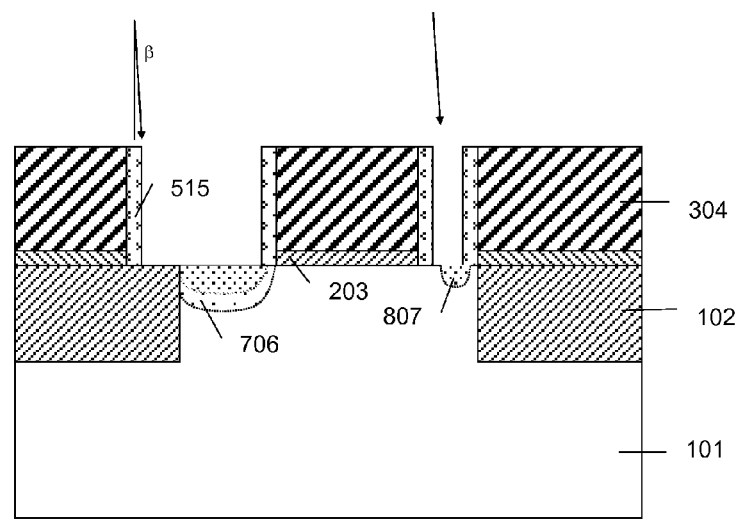
FIG. 8 is a cross-sectional diagram illustrating second ion implantation and subsequent annealing.

As shown in FIG. 8, second ion implantation is performed, and an implantation tilt angle β is selected to cause ions to impinge on part but not all of the semiconductor substrate surface exposed in the second window Annealing is performed to activate the implanted ions, thereby forming highly doped regions 807, having a doping type opposite to that of the substrate, in the region corresponding to the second window and in the region corresponding to the first window. The doped region 807 in the region corresponding to the first window is enclosed in the region 706, while the doped region 807 in the region corresponding to the second window form a P-N junction with the substrate 101.

Figure 9:
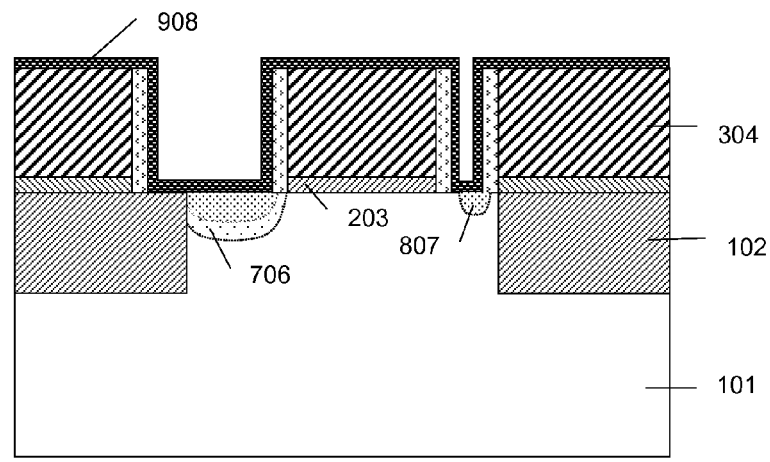
FIG. 9 is a cross-sectional diagram illustrating deposition of a metal layer.

As shown in FIG. 9, a metal layer 908 is deposited on the substrate. Layer 908 can be nickel, cobalt, titanium, and platinum, or a mixture thereof.

Figure 10:
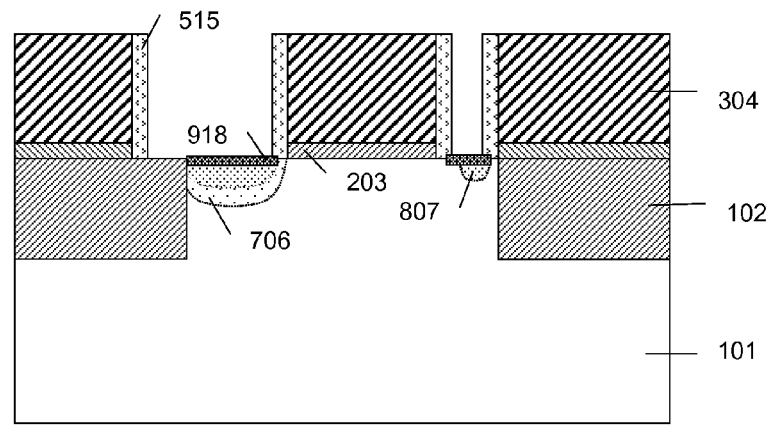
FIG. 10 is a cross-sectional diagram illustrating an asymmetric source-drain field-effect transistor formed after annealing and removal of the metal layer.
Figure 11:
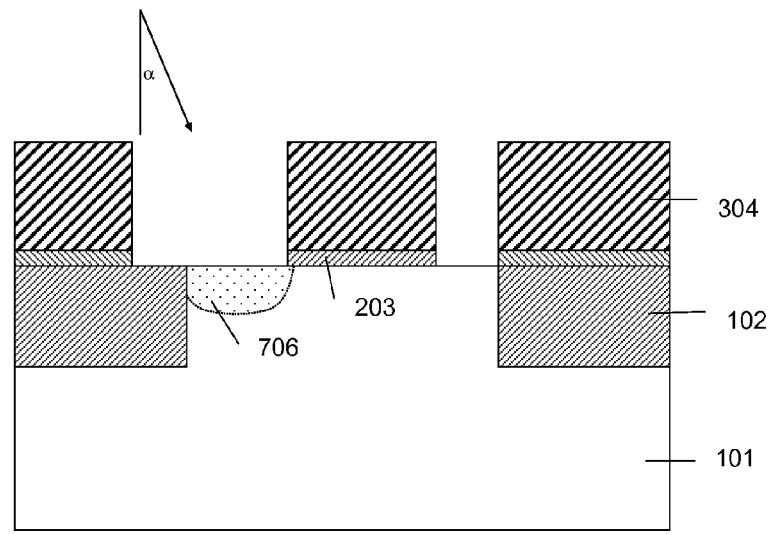
FIG. 11 is a cross-sectional diagram illustrating first ion implantation and subsequent annealing, according to an alternative embodiment of the present invention.

During annealing, the metal layer 908 reacts with the semiconductor substrate exposed in the regions corresponding to the first and second windows, forming a metal-semiconductor compound conductor layer 918, as shown in FIG. 10. The conductor layer 918 is exposed after the metal layer 908 is removed. The conductor layer 918 can be any of nickel silicide, nickel germanide, cobalt silicide, cobalt germanide, titanium silicide, titanium germanide, platinum silicide, and platinum germanide, or a mixture thereof. Without departing from the spirit of the present invention, other processes can be also be used to form the conductor layer 918.

Following is description of making an asymmetric source-drain field-effect transistor according to an alternative embodiment of the present invention.

As shown in FIG. 1 a semiconductor substrate 101 is first prepared and various processes such as cleaning and native oxide removal are completed before film growth. Afterwards, isolation structures 102 around the transistor are fabricated using shallow trench isolation processes. In this embodiment, the semiconductor substrate is single crystal silicon.

As shown in FIG. 2, a first insulating dielectric layer 203 is formed on the semiconductor substrate. A first electrode layer 304 is formed subsequently on the first insulating dielectric layer 203, as shown by the cross-sectional diagram in FIG. 3.

As shown in FIG. 4, the electrode layer and the first insulating layer are patterned using photolithography and etching processes, and first and second windows are formed at the regions for forming the source and drain. The source region is to be formed in the region corresponding to the first window while the drain region is to be formed in the region corresponding to the second window, or vice versa. The first window is wider than the second window.

Figure 6:
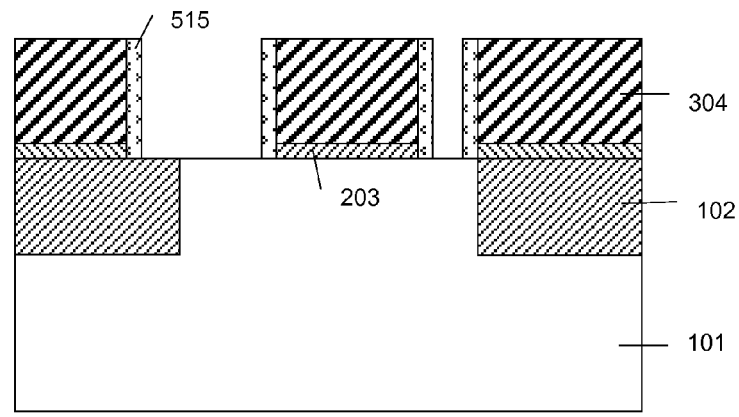
FIG. 6 is a cross-sectional diagram illustrating formation of first sidewall structures by an etching process.

As shown in FIG. 6, the second insulating dielectric layer is anisotropically etched using a dry etch process, forming sidewalls 515. Sidewalls 515 have a thickness smaller than half the width of the second window.

Figure 12:
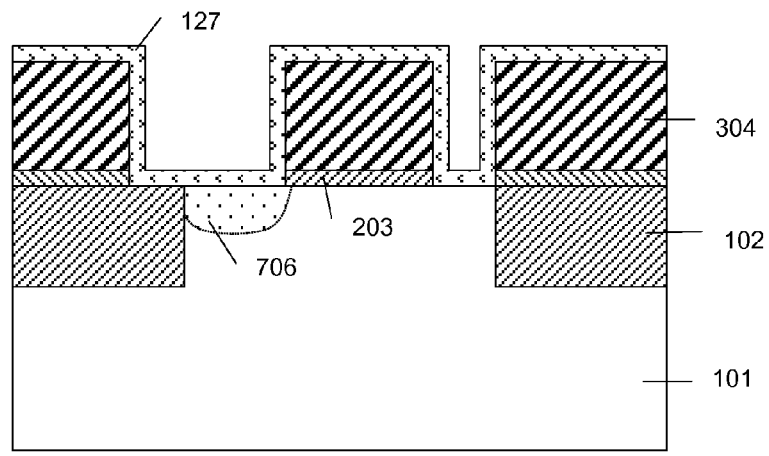
FIG. 12 is a cross-sectional diagram illustrating formation of the second dielectric layer by deposition, according to an alternative embodiment of the present invention.

As shown in FIG. 12, a second insulating dielectric layer 127 is deposited having a thickness smaller than half the width of the second window.

As shown in FIG. 7, the second insulating dielectric layer is anisotropically etched using a dry etch process, forming sidewalls 515. Sidewalls 515 have a thickness smaller than half the width of the second window.

As shown in FIG. 8, second ion implantation is performed, and an implantation tilt angle β is selected to cause ions to impinge on part but not all of the semiconductor substrate surface exposed in the second window Annealing is performed to activate the implanted ions, thereby forming highly doped regions 807, having a doping type opposite to that of the substrate, in the region corresponding to the second window and the region corresponding to the first window. The doped region 807 in the region corresponding to the first window is enclosed in the region 706, while the doped region 807 in the region corresponding to the second window form a P-N junction with the substrate 101.

As shown in FIG. 9, a metal layer 908 is deposited on the substrate. Layer 908 can be nickel, cobalt, titanium, and platinum, or a mixture thereof.

During annealing, the metal layer 908 reacts with the semiconductor substrate exposed in the regions corresponding to the first and second windows, forming a metal-semiconductor compound conductor layer 918, as shown in FIG. 10. The conductor layer 918 is exposed after the metal layer 908 is removed. The conductor layer 918 can be any of nickel silicide, nickel germanide, cobalt silicide, cobalt germanide, titanium silicide, titanium germanide, platinum silicide, and platinum germanide, or a mixture thereof. Without departing from the spirit of the present invention, other processes can be also be used to form the conductor layer 918.

Following is description of making an asymmetric source-drain field-effect transistor according to yet another alternative embodiment of the present invention.

As shown in FIG. 1 a semiconductor substrate 101 is first prepared and various processes such as cleaning and native oxide removal are completed before film growth. Afterwards, isolation structures 102 around the transistor are fabricated using shallow trench isolation processes. In this embodiment, the semiconductor substrate is single crystal silicon.

As shown in FIG. 2, a first insulating dielectric layer 203 is formed on the semiconductor substrate. A first electrode layer 304 is formed subsequently on the first insulating dielectric layer 203, as shown by the cross-sectional diagram in FIG. 3.

As shown in FIG. 4, the electrode layer and the first insulating layer are patterned using photolithography and etching processes, forming first and second windows at the regions for forming the source and drain. The source region is to be formed in the region corresponding to the first window while the drain region is to be formed in the region corresponding to the second window, or vice versa. the first window being wider than the second window.

As shown in FIG. 5, a second insulating dielectric layer 505 is deposited. Subsequently, the insulating dielectric layer is anisotropically etched using a dry etch process, forming sidewalls 515. Sidewalls 515 have a thickness smaller than half the width of the second window, as shown by the cross-sectional diagram in FIG. 6.

As shown in FIG. 7, first ion implantation is performed, and an implantation tilt angle α is selected to cause ions to arrive at the semiconductor substrate exposed in the first window while no ions arrive at the semiconductor substrate exposed in the second window. Annealing is performed to activate the implanted ions, thereby forming in the semiconductor substrate in the region corresponding to the first window a doped region 706 with a doping type opposite to that of the substrate. The doped region 706 forms a P-N junction with the substrate.

Figure 13:
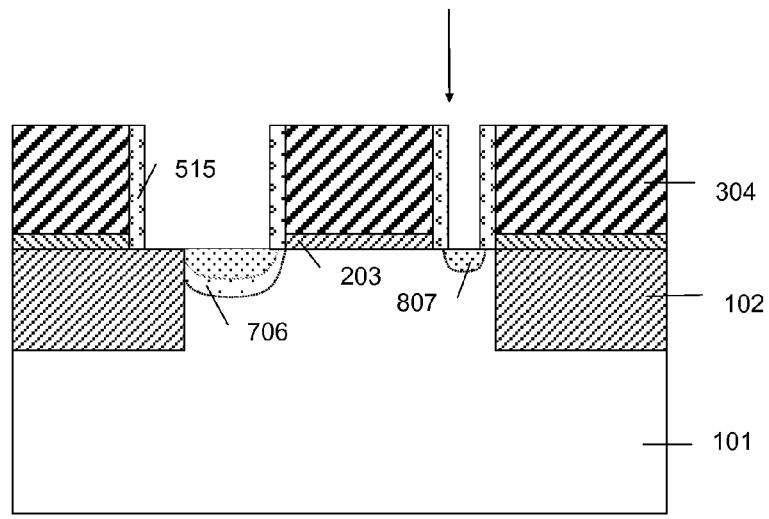
FIG. 13 is a cross-sectional diagram illustrating second ion implantation and subsequent annealing, according to an alternative embodiment of the present invention.

As shown in FIG. 13, the second ion implantation is performed and annealing is performed to activate the implanted ions, thereby forming highly doped regions 807, having a doping type opposite to that of the substrate, in the region corresponding to the second window and the region corresponding to the first window. The doped region 807 in the region corresponding to the first window is enclosed in the region 706, while the doped region 807 in the region corresponding to the second window form a P-N junction with the substrate 101.

Figure 14:
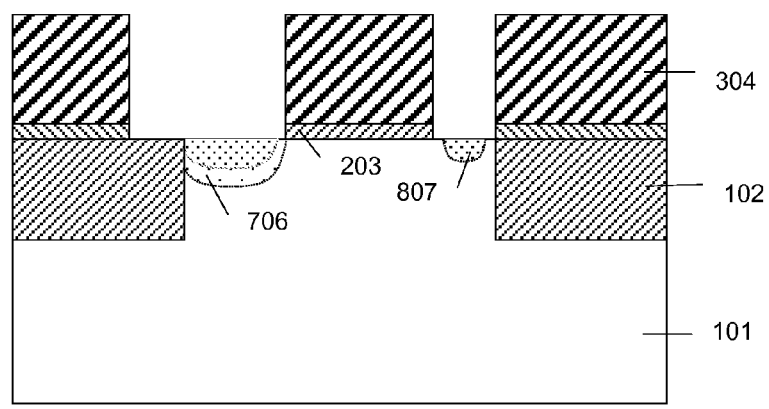
FIG. 14 is a cross-sectional diagram illustrating removal of sidewall structures by an etching process, according to an alternative embodiment of the present invention.

The sidewalls 515 are removed by etching, as shown by the cross-sectional diagram illustrating in FIG. 14.

Figure 15:
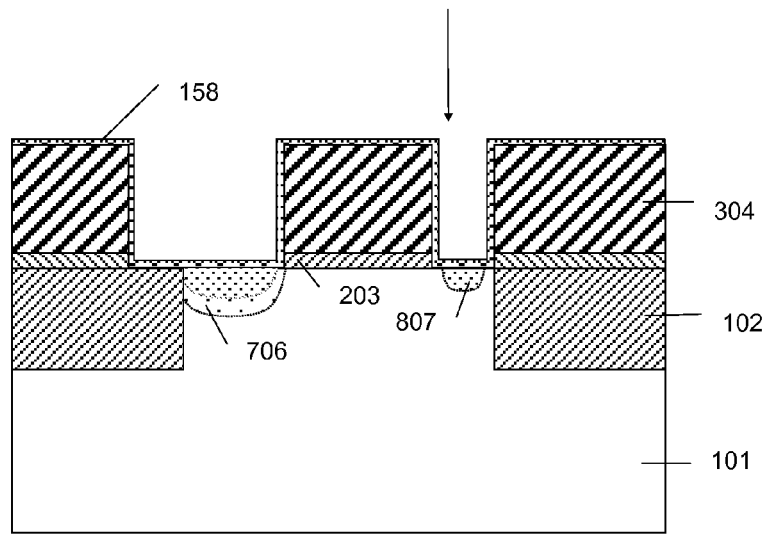
FIG. 15 is a cross-sectional diagram illustrating formation by deposition of a third insulating dielectric layer according to an alternative embodiment of the present invention.

A third insulator layer 158 is formed. Layer 158 is thinner than the second insulator layer 505, as shown by the cross-sectional diagram illustrating in FIG. 15.

Figure 16:
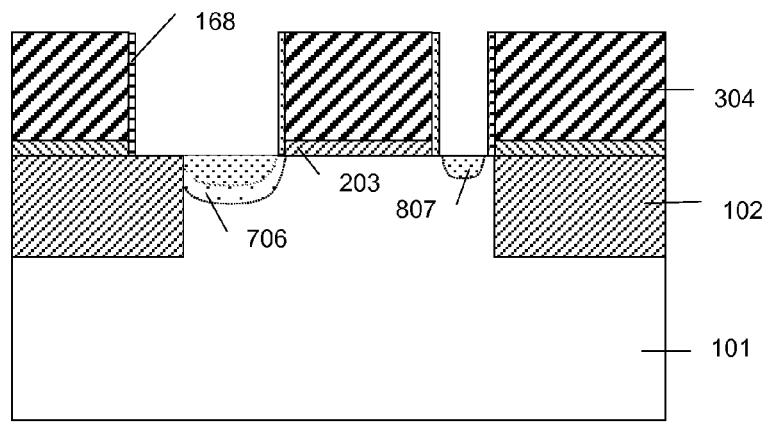
FIG. 16 is a cross-sectional diagram illustrating formation by etching second sidewall structures according to an alternative embodiment of the present invention.

As shown in FIG. 16, the third insulator layer 158 is anisotropically etched using a dry etch process, forming sidewalls 168. Sidewalls 168 are thinner than the sidewalls 515 formed by etching the second insulator layer, so that at least some of the substrate 101 around region 807 in the region corresponding to the second window is exposed.

Figure 17:
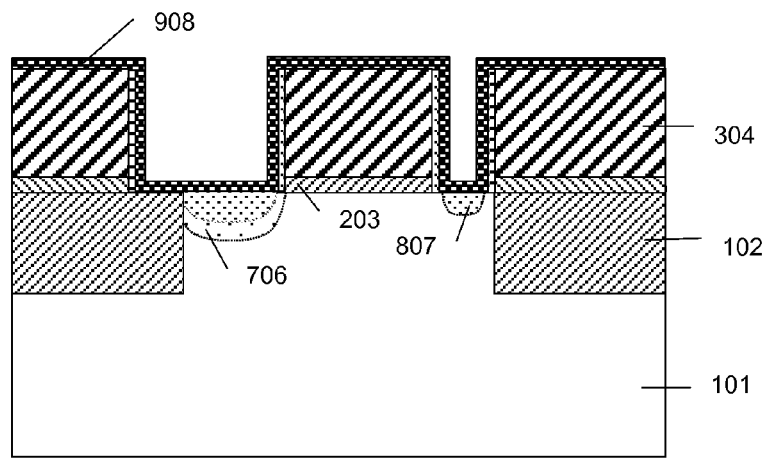
FIG. 17 is a cross-sectional diagram illustrating deposition of a metal layer according to an alternative embodiment of the present invention.

As shown in FIG. 17, a metal layer 908 is deposited. Layer 908 can be nickel, cobalt, titanium, and platinum, or a mixture thereof.

Figure 18:
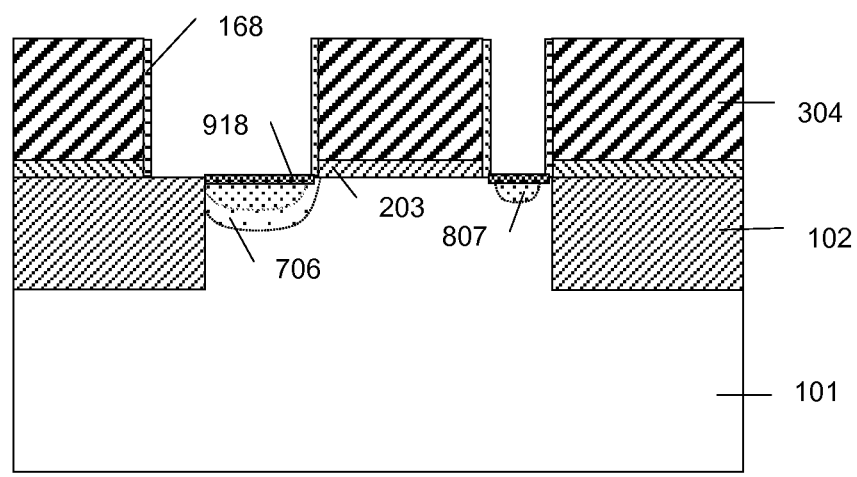
FIG. 18 is a cross-sectional diagram illustrating a formed asymmetric source-drain field-effect transistor after annealing and removal of the metal layer according to an alternative embodiment of the present invention.

During annealing, the metal layer 908 reacts with the semiconductor substrate exposed in the regions corresponding to the first and second windows, forming a metal-semiconductor compound conductor layer 918, as shown in FIG. 18. The conductor layer 918 is exposed after the metal layer 908 is removed. The conductor layer 918 can be any of nickel silicide, nickel germanide, cobalt silicide, cobalt germanide, titanium silicide, titanium germanide, platinum silicide, and platinum germanide, or a mixture there of. Without departing from the spirit of the present invention, other processes can be also be used to form the conductor layer 918.

We claim:

1. A method of making an asymmetric source-drain field-effect transistor, comprising:
   (a) forming isolation structures in a semiconductor substrate;
   (b) forming a first insulating dielectric layer and an electrode layer over the first insulating dielectric layer;
   (c) forming first window and second window in the electrode layer and the first insulating dielectric layer, the second window having a width smaller than a width of the first window, the first window exposing a first semiconductor substrate region and the second window exposing a second semiconductor substrate region;
   (d) implanting ions at a first tilt angle such that ions impinge on the first semiconductor substrate region but not on the second semiconductor substrate region, and annealing to activate ions implanted at the first tilt angle, thereby forming a first doped region, the first doped region forming a first P-N junction with the semiconductor substrate;
   (e) implanting ions at a second tilt angle such that ions impinge on the first semiconductor substrate region and part of the second semiconductor substrate region, and annealing to activate ions implanted at the second tilt angle, thereby forming a second doped region occupying part of the second semiconductor substrate region and a highly doped region in the first semiconductor substrate region, the highly doped region being within the first doped region, the second doped region forming a second P-N junction with the semiconductor substrate; and
   (f) forming a metal-semiconductor-compound conductor layer over the first semiconductor substrate region and the second semiconductor substrate region, the metal-semiconductor-compound conductor layer forming a Schottky junction with the semiconductor substrate, the Schottky junction located at part of the second semiconductor substrate region not occupied by the second doped region.

2. The method of making an asymmetric source-drain field-effect transistor according to claim 1, wherein the semiconductor substrate is silicon, germanium, silicon-germanium alloy, a silicon-on-insulator (SOI) structure or germanium-on-insulator (GOI) structure.

3. The method of making an asymmetric source-drain field-effect transistor according to claim 1, wherein the first dielectric layer is silicon dioxide, silicon nitride, aluminum oxide or a hafnium-based high-K dielectric material.

4. The method of making an asymmetric source-drain field-effect transistor according to claim 1, wherein the electrode layer includes at least one conductive layer, and the conductive layer includes any of polysilicon, titanium nitride, tantalum nitride, tungsten, and metal silicide, or a multilayer structure thereof.

5. The method of making an asymmetric source-drain field-effect transistor according to claim 1, wherein a peak doping density in the semiconductor substrate after implanting ions at the second tilt angle is about $1*10^{19} cm^{-3}$ or higher.

6. The method of making an asymmetric source-drain field-effect transistor according to claim 1, wherein the metal layer includes any of nickel, cobalt, titanium, and platinum, or a mixture thereof.

7. The method of making an asymmetric source-drain field-effect transistor according to claim 1, wherein the metal-semiconductor-compound conductor layer includes any of nickel silicide, nickel germanide, cobalt silicide, cobalt germanide, titanium silicide, titanium germanide, platinum silicide, and platinum germanide, or a mixture there of.

8. The method of making an asymmetric source-drain field-effect transistor according to claim 1, further comprising, after Step (e) and before Step (f):
   removing the first sidewall structures; and
   forming second sidewall structures along sides of the first window and second window, the second sidewall structures being thinner than the first sidewall structures such that portions of the semiconductor substrate previously covered by the first sidewall structures are exposed after forming the second sidewall structures, thereby allowing the metal-semiconductor-compound conductor layer to form on the exposed portions of the semiconductor substrate.

9. The method of making an asymmetric source-drain field-effect transistor according to claim 1, wherein the second tilt angle is selected such that ions implanted at the second tilt angle impinge on part but not all of the second semiconductor substrate region.

10. An asymmetric source-drain field-effect transistor made using the method of claim 1, the asymmetric source-drain field-effect transistor comprising asymmetrical source/drain regions, one of the asymmetrical source/drain regions is comprised of the first P-N junction while the other one of the asymmetrical source/drain regions is comprised of a mixed junction, the mixed junction being a mixture of the Schottky junction and the second P-N junction.

11. The method of making an asymmetric source-drain field-effect transistor according to claim 1, wherein the second tilt angle is less than the first tilt angle.

12. The method of making an asymmetric source-drain field-effect transistor according to claim 1, wherein the first window further exposes a portion of one of the isolation structures such that ions implanted at the first tilt angle impinge on the first semiconductor substrate region.

13. The method of making an asymmetric source-drain field-effect transistor according to claim 1, wherein forming the metal-semiconductor-compound conductor layer comprises:
- depositing a metal layer over the first semiconductor substrate region and the second semiconductor substrate region;
- annealing to allow the metal layer to react with semiconductor in the first semiconductor substrate region and the second semiconductor substrate region; and
- removing part of the metal layer not having reacted with the semiconductor during annealing.

14. The method of making an asymmetric source-drain field-effect transistor according to claim 8, wherein the first semiconductor substrate region is between the second sidewall structures in the first window and the second semiconductor substrate region is between the second sidewall structures in the second window.

15. The method of making an asymmetric source-drain field-effect transistor according to claim 8, wherein the second tilt angle is 0 degrees.

* * * * *